United States Patent

Takamatsu et al.

[11] Patent Number: 6,155,540
[45] Date of Patent: Dec. 5, 2000

[54] APPARATUS FOR VAPORIZING AND SUPPLYING A MATERIAL

[75] Inventors: Yukichi Takamatsu; Takeo Yoneyama; Yoshiyasu Ishihama, all of Kanagawa-ken, Japan

[73] Assignee: Japan Pionics Co., Ltd., Tokyo, Japan

[21] Appl. No.: 09/158,781

[22] Filed: Sep. 23, 1998

[30] Foreign Application Priority Data

Sep. 30, 1997 [JP] Japan ................................. 9-282746

[51] Int. Cl.$^7$ .............................................. B01F 3/04
[52] U.S. Cl. .......................... 261/78.2; 261/81; 261/138; 261/DIG. 65
[58] Field of Search ................ 261/78.2, DIG. 65, 261/138, 81; 122/31.1

[56] References Cited

U.S. PATENT DOCUMENTS

| | | | |
|---|---|---|---|
| 4,310,474 | 1/1982 | Iyengar | 261/DIG. 65 |
| 4,335,804 | 6/1982 | Bardin et al. | 261/78.2 |
| 5,173,274 | 12/1992 | Owen | 261/78.2 |
| 5,372,754 | 12/1994 | Ono | 261/78.2 |

Primary Examiner—David A. Simmons
Assistant Examiner—Robert A. Hopkins
Attorney, Agent, or Firm—Oblon, Spivak, McClelland, Maier & Neustadt, P.C.

[57] ABSTRACT

An apparatus for vaporizing a liquid material and supplying the material in a gas phase, in which a liquid material for CVD is introduced into a vaporizer at a controlled flow rate, atomized by an ultrasonic atomizing device disposed at the inside or the outside of the vaporizer, heated by a circular flow of a carrier gas and vaporized. When a liquid material for CVD is supplied to a CVD apparatus in the production of semiconductors, the concentration of the material is controlled easily in the vaporization, the concentration of the material in the gas can be changed quickly in response with the change in the flow rate of the material, decomposition of the material does not occur and the operating condition of a CVD apparatus is not restricted.

10 Claims, 5 Drawing Sheets

APPARATUS FOR VAPORIZING AND SUPPLYING A MATERIAL

BACKGROUND OF THE INVENTION

1. Field of the Invention

The present invention relates to an apparatus for vaporizing and supplying a material which is used for supplying a gas to a chemical vapor deposition (CVD) apparatus or a physical vapor deposition (PVD) apparatus used for production of semiconductors. More specifically, the present invention relates to an apparatus which vaporizes and supplies a liquid CVD material for production of semiconductors which is unstable at higher temperatures highly accurately at a desired flow rate without causing deterioration in the quality.

2. Description of the Related Arts

Forming films such as semiconductor films, insulation films and metal films is necessary in the production of semiconductor devices. The major processes for forming films are the physical vapor deposition (PVD) in which vacuum vapor deposition or sputtering is used and the chemical vapor deposition (CVD) in which light energy or heat energy is used. CVD is mainly used because of easier control. In accordance with this process, a material for the treatment is placed in an atmosphere of a CVD gas such as an organometallic compound which is supplied from an apparatus for supplying a gas. The CVD gas is decomposed by supplying light energy or heat energy to the material for the treatment, and a film such as a semiconductor film, insulation film or a metal film is formed on the surface of the material for the treatment.

Films having more improved properties are required as semiconductor devices having higher degrees of integration and showing higher speeds are supplied with more variety. Organosilicon compounds and organoaluminum compounds have heretofore been used as the CVD material for forming the above films. Under the above circumstances, other organic compounds such as organotantalum compounds, organobarium compounds, organotitanium compounds, organotungsten compounds, organocopper compounds, organostrontium compounds and organozirconium compounds are also being examined as the CVD material for forming the above films.

When any of the above CVD material is used, it is necessary that the supplied gas in the production of semiconductors have a high purity and that the concentration of the gas and the amount of the supply be accurately controlled. Many of the above materials have low vapor pressures and high viscosities and are unstable at high temperatures. Therefore, it is also necessary that a CVD material be vaporized and supplied to a CVD apparatus without deterioration in the quality.

Various methods for vaporizing a CVD material and supplying the material to a CVD apparatus in a vapor phase have been known. Examples of such methods include (1) a method in which a carrier gas is blown into a heated liquid material to vaporize the material, (2) a method in which a liquid material at an ordinary or raised temperature is evacuated to form the vapor of the material, (3) a method in which a liquid material is sprayed to a heated vaporizer under a pressure to form the vapor of the material (Japanese Patent Application Laid-Open No. Heisei 6(1994)-310444), (4) a method in which a carrier gas is introduced into the vapor phase portion of a liquid material in a heated vessel to decrease the concentration of the material in the vapor phase and the vapor of the material is supplemented from the liquid phase, and (5) a method in which a liquid material is atomized by an ultrasonic vibrator disposed at a lower part of a vessel of the liquid material and then introduced into a heated vaporizer to form the vapor of the material (Japanese Patent Application Laid-Open No. Heisei 7(1995)-278817).

However, the above methods have the following problems. In the method (1), the concentration of the gas obtained by the vaporization is different depending on the amount of the supplied carrier gas and the efficiency of contact between the liquid material and the carrier gas, and a portion of the material becomes a mist rather than the vapor. In the method (2), the condition of the operation of a CVD apparatus is limited to a reduced pressure. In the method (3), the amount supplied to a CVD apparatus cannot be set to a desired value because the condition of the material obtained by the atomization is different to a great extent depending on the pressure and the flow rate in the spraying under a pressure. In the method (4), the liquid material is decomposed and deteriorated while being heated in the vessel. In the method (5), the control of the concentration of the vaporized gas is difficult because the liquid material is supplied in the atomized condition, and a filter or a collision plate must be disposed in the vaporizer to prevent supplying a mist of the material to a CVD apparatus.

SUMMARY OF THE INVENTION

Under the above circumstances, development of an apparatus for vaporizing and supplying a material, which does not deteriorate the quality of the CVD material, enables easy control of the concentration of the material in the vaporization and quick change in the concentration of the material in the gas in response with the change in the flow rate of the material and does not restrict the operating conditions of the CVD apparatus, has been desired.

As the result of extensive studies by the present inventors, it was found that the above problems of the conventional methods can be solved when the apparatus has a part for controlling liquid flow rate which controls the flow rate of the material and an atomizer using an ultrasonic vibrator and the liquid material is simultaneously atomized and vaporized in the vapor phase by utilizing a circular flow of a heated carrier gas. The present invention has been completed on the basis of this knowledge.

Accordingly, the present invention provides an apparatus for vaporizing a liquid material and supplying the material in a gas phase, which comprises a vessel of the liquid material, a part for controlling liquid flow rate, an ultrasonic atomizing device and a vaporizer which is equipped with at least one inlet for the liquid material, at least one inlet for a carrier gas and an outlet for a vaporized gas, has a shape of a sphere, a shape of an ellipsoid, a shape of a barrel, a shape of a cylinder, a cone, a truncated cone or a hemisphere each having a round surface at end parts, a shape similar to these shapes or a combination of these shapes and vaporizes the liquid material in a vapor phase.

The apparatus of the present invention is applied to vaporizing a liquid material and supplying the vaporized material to a CVD apparatus in the production of semiconductors.

In the apparatus of the present invention, a liquid material is introduced into a vaporizer or a part close to an inlet of a vaporizer in the liquid state at a controlled flow rate, atomized by an ultrasonic atomizing vibrator disposed at the outside or the inside of the vaporizer, is vaporized quickly by being heated with a circular flow of a carrier gas in the vaporizer and is supplied to a CVD apparatus in the vapor phase.

DESCRIPTION OF THE PREFERRED EMBODIMENTS

Figure 1:
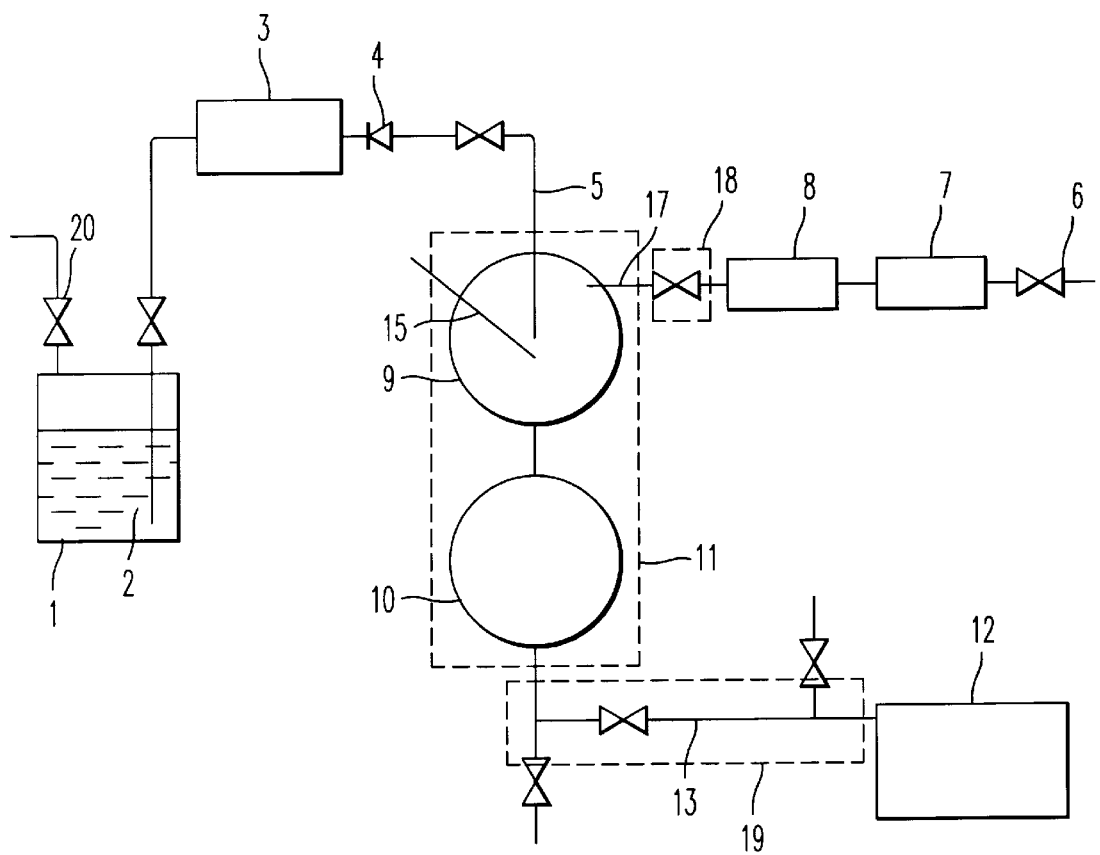
FIG. 1 shows a schematic diagram exhibiting an example of the apparatus of the present invention.

The vaporizer in the apparatus of the present invention generally has a shape of a sphere, a shape of an ellipsoid, a shape of a barrel, a shape of a cylinder, a cone, a truncated cone or a hemisphere each having curved surfaces at end parts, a shape similar to these shapes or a combination of these shapes. The shape of a cone includes shapes of a circular cone, an elliptical cone and a triangular cone and the like shape. A simple shape is preferable for the vaporizer to facilitate a circular flow of a carrier gas. A spherical shape is more preferable. Shapes of an ellipsoid and a barrel are also preferably used. "A shape similar to these shapes" means a shape which is approximately the same as the above shapes or substantially equivalent to the above shapes, such as a shape partially modified from a shape of a sphere, a shape of an ellipsoid, a shape of a barrel or a shape of a cylinder, a cone, a truncated cone or a hemisphere each having round surfaces at end parts without particular additional effects. "An end part" means a part where a plane or a curved surface intersects with another plane or curved surface. For example, an end part of a shape of a cylinder means a circular circumferential part at the upper or lower face of the cylinder. A vaporizer having a shape of a cylinder, a barrel, a cone, a truncated cone or a hemisphere each having curved surfaces at end parts is used in order to facilitate flow of the gas at the end parts and to prevent accumulation of substances attached to the end parts because of stagnant flow of the gas.

The size of the vaporizer is different depending on the amount of the vaporized gas to be supplied to the CVD apparatus and cannot generally be defined. The vaporizer generally has a size corresponding to a sphere having an inner diameter of about 70 to 250 mm, preferably about 100 to 150 mm.

The inlet for a carrier gas is preferably disposed at an upper part of the vaporizer in such a manner that the carrier gas makes a circular flow along the surface of the inner wall of the vaporizer. Specifically, one or more inlets for a carrier gas are disposed in the vaporizer in the following manner: the direction of the inlet is parallel with a surface perpendicular to the outlet for the vaporized gas; and, at the point where the extension of the direction of the introduction of the carrier gas intersects with the inner wall of the vaporizer, the extended direction is oblique with respect to the direction of the tangent of the inner face of the vaporizer at the intersection, i.e., the carrier gas is introduced in the direction having a desired angle with the direction of the tangent except for the direction perpendicular to the direction of the tangent. It is preferable that the above angle is 0 to 45 degrees. Actually, the inlet for a carrier gas can be disposed in such a manner that the carrier gas is introduced in an oblique direction with respect to the tangent of the inner face of the vaporizer at the position where the inlet for a carrier gas is disposed, i.e., in the direction having any desired angle with the direction of the tangent except for the direction perpendicular to the tangent and the direction parallel with the tangent.

It is particularly preferable in the present invention that the inlets for a carrier gas are disposed at an upper part of the vaporizer and the outlet for the vaporized gas is disposed at a lower part of the vaporizer and that each inlet for a carrier gas is disposed in the following manner: at the point where the extension of the direction of the introduction of the carrier gas intersects with the inner wall of the vaporizer or at the position where the inlet for a carrier gas is attached to the vaporizer, the direction of the inlet for a carrier gas is oblique with respect to the direction of the tangent of the inner face of the vaporizer, i.e., the carrier gas is introduced in the direction having an angle of 0 to 45 degrees with the direction of the tangent. It is also preferable as an embodiment of the present invention that the inlet for a carrier gas is disposed in a direction having an angle of 0 to 15 degrees downward or 0 to 5 degrees upward with the horizontal plane.

In the present invention, heat transfer from the wall of the vaporizer can be facilitated and the temperature distribution can be made uniform by the circular flow of the carrier gas. The instantaneous vaporization takes place when the atomized liquid material is brought into contact with the circular flow of the carrier gas. The flow rate of the carrier gas can suitably be decided in accordance with the operating conditions of the CVD apparatus and the amount of the CVD material to be supplied.

The circular flow means a series of flow of the carrier gas comprising introduction of the gas into the vaporizer through the inlet for a carrier gas, circular flow of the gas along the inner wall of the vaporizer and discharge of the gas through the outlet for a vaporized gas.

In the present invention, an ultrasonic atomizing device is disposed at the inside or the outside of the vaporizer. When the ultrasonic atomizing device is disposed at the outside of the vaporizer, it is preferable that the device is disposed at the inlet for a liquid material of the vaporizer. For example, the ultrasonic atomizing device is disposed at the center or at the side face of the path of the liquid material.

When the ultrasonic atomizing device is disposed at the inside of the vaporizer, the ultrasonic atomizing device is disposed in such a manner that an ultrasonic atomizing vibrator is disposed around the central part of the vaporizer. An inlet for the liquid material is disposed in such a manner that the introduced liquid material is directly brought into contact with the vibrator. A single or a plurality of inlets for the liquid material may be disposed.

The output, the shape and the size of the ultrasonic vibrator are not particularly limited, and the output and the frequency of the ultrasonic wave and the shape of the vibrator are suitably decided in accordance with the type of the liquid material, the amount supplied and the temperature so that the liquid material can be atomized efficiently. For example, when an ultrasonic vibrator has an output of 0.5 to 5 W at a frequency of 40 to 120 kHz, a liquid material can be atomized into fine particles having a diameter of about 0.1 to 20 $\mu$m.

The vibrator may have a small vessel for the liquid material. However, such a vessel is not always necessary because, when the vibrator has a sufficient output, the liquid material is atomized immediately when it is brought into contact with the vibrator.

It is preferable that the inlet for a liquid material is disposed at the uppermost central part of the vaporizer. It is also preferable that the inlet for a liquid material is disposed in the direction of the center of the vaporizer. The outlet for a vaporized gas is preferably disposed at a lower part of the vaporizer.

The vaporizer used in the present invention can be heated and kept at a desired temperature in accordance with the type and the supplied amount of the liquid material, the concentration of the vaporized gas and other operating conditions. The heating can be conducted using a ribbon heater wound around the vaporizer, a block heater having a shape covering the vaporizer or by circulation of hot air or a liquid heat medium. The method of heating is not particularly limited as long as the vaporizer is heated and kept at the desired temperature accurately.

The temperature of the vaporizer is different depending on the operating conditions of the CVD apparatus and the vapor pressure and the amount of the CVD material. The temperature is generally 40 to 250° C. The heater is constructed so as to maintain the temperature accurately.

The apparatus of the present invention further comprises a vessel of a liquid material, a part for controlling liquid flow rate, an ultrasonic wave generator, lines for supplying a carrier gas and for transferring a vaporized gas which are connected to the vaporizer, valves, adjusting valves and instruments for measurements of pressure and temperature. The apparatus further comprises heaters for maintaining the temperature in the lines for supplying a carrier gas and for transferring a vaporized gas from the apparatus for vaporizing and transferring a material to a CVD apparatus.

Because the apparatus for vaporizing and supplying a material has the above construction, the liquid material can be supplied at an accurate flow rate, efficiently atomized, completely vaporized by the circular flow of the carrier gas and supplied to a CVD apparatus as a vaporized gas.

As the material of the vessel of a liquid material, the part for controlling liquid flow rate and the vaporizer at portions which are in contact with the liquid or the gas, a metal material resistant to corrosion such as SUS316 and SUS316L is generally used in order to prevent corrosion, elution of impurities and leak of the gas. It is preferable that the above metal material is treated by electropolishing.

It is preferable that fittings used for connecting the vessel of a liquid material, the part for controlling liquid flow rate, the vaporizer and the CVD apparatus have a helium leak rate of $10^{-9}$ Torr•liter/sec or less. Examples of such fittings include VCR fitting (manufactured by CAJON COMPANY), MCG fitting (manufactured by TOYOKO KAGAKU Co., Ltd.), other fittings corresponding to these fittings and welded fittings. The above fittings can be used advantageously.

The apparatus of the present invention is described specifically with reference to the following Figures. However, the present invention is not limited to the Figures.

FIG. 1 shows a schematic diagram exhibiting an example of the apparatus of the present invention. 1 shows a vessel of a liquid material. 3 shows a part for controlling liquid flow rate, wherein a twin bellows pump which can adjust the flow rate at a desired value is used and a check valve 4 is disposed at the outlet of the pump. 6 shows a line for supplying a carrier gas. A carrier gas is introduced into a vaporizer 9 through the part for controlling gas flow rate 7 and a gas heater 8.

A buffer tank 10 having the same size and shape as those of the vaporizer is disposed below the vaporizer. The vaporizer and the buffer tank are covered with a block heater 11 having a shape fitting the shapes of the vaporizer and the buffer tank so that the vaporizer and the buffer tanks are maintained at a desired temperature. A line 13 for supplying a vaporized gas from the buffer tank to a CVD apparatus 12 is also heated and maintained at a desired temperature.

Figure 2:
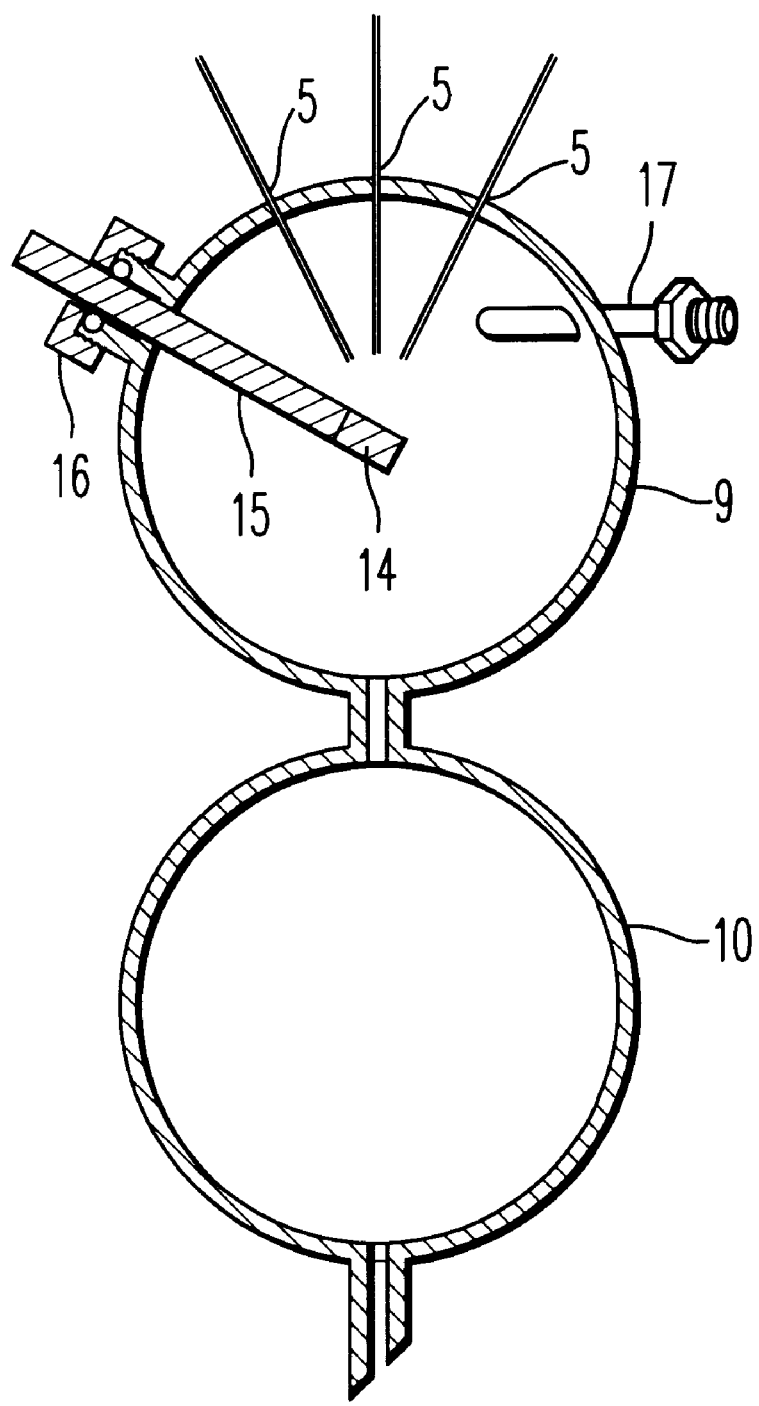
FIG. 2 and FIG. 3 each shows a section view exhibiting an example of the vaporizer used in the present invention. An ultrasonic atomizing device is disposed at the inside of a vaporizer shown in FIG. 2 and at the outside of a vaporizer shown in FIG. 3.

FIG. 2 shows a section view of an example of the vaporizer used in the present invention. The vaporizer has a spherical shape and has inlets for a liquid material 5 at upper parts. In the example of the vaporizer shown in FIG. 2, three inlets for a liquid material are disposed. An ultrasonic atomizing device 15 is disposed in such a manner that an ultrasonic vibrator 14 is disposed at the central part of the vaporizer. The ultrasonic atomizing device is sealed tightly from the outside with a V ring 16 made of a metal. Two inlets for a carrier gas 17 are disposed at upper parts of the vaporizer (One inlet alone is shown in FIG. 2 because the Figure shows the section view). Each inlet for a carrier gas is disposed in the direction parallel with a plane perpendicular to the outlet of a vaporized gas and oblique with respect to the inner wall of the vaporizer at the position where the inlet for a carrier gas is disposed so that the carrier gas is introduced into the vaporizer along the inner wall.

In this apparatus, a liquid material 2 is introduced into the vaporizer from the vessel of a liquid material through the part for controlling liquid flow rate. The liquid material is atomized in the vaporizer by the ultrasonic vibrator and brought into contact with a circular flow of the carrier gas which has been heated in advance. The liquid material is instantaneously heated and vaporized. The gas obtained by the vaporization is supplied to the CVD apparatus through a buffer tank.

Figure 3:
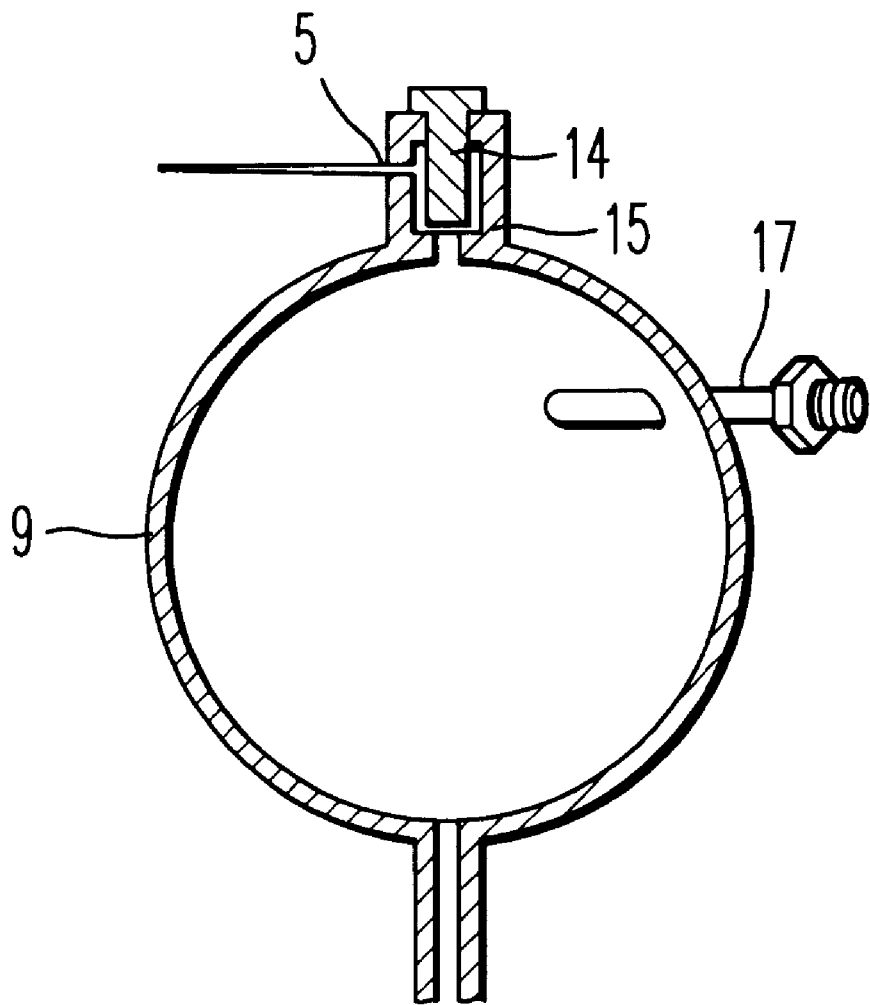

FIG. 3 shows a section view of an example of a vaporizer in which an ultrasonic atomizing device is disposed at the outside of the vaporizer. The ultrasonic atomizing device 15 comprising an ultrasonic vibrator 14 is disposed at an inlet for a liquid material 5. The liquid material supplied from the vessel of a liquid material through the part for controlling liquid flow rate is atomized by the above ultrasonic vibrator 14 at the inlet for a liquid material 5 and introduced into the vaporizer. The introduced liquid material is brought into contact with the circular flow of the carrier gas which has been heated in advance and instantaneously heated and vaporized.

The condition of the CVD material supplied to the apparatus of the present invention is not particularly limited as long as the material can be maintained in the liquid state and can suitably be selected in accordance with the application. For example, the material may be a liquid at an ordinary temperature or a solid dissolved in a solvent. Examples of the CVD material include trimethylaluminum ($Al(CH_3)_3$), dimethylaluminum hydride ($Al(CH_3)_2H$), triisobutylaluminum ($Al(i-C_4H_9)_3$), tetraethoxysilane ($Si(OC_2H_5)_4$), hexacarbonylmolybdenum ($Mo(CO)_6$), dimethylpentoxygold ($Au(CH_3)_2(OC_5H_7)$), pentaethoxytantalum ($Ta(OC_2H_5)_5$), tetrapropioxytitanium ($Ti(OC_3H_7)_4$), tetrabutoxyzirconium ($Zr(OC_4H_9)_4$), hexafluoroacetylacetonecopper vinyltrimethylsilane (($CF_3CO)_2CHCu•CH_2CHSi(CH_3)_3$), hexafluoroacetylacetonecopper allyltrimethylsilane (($CF_3CO)_2CHCu•CH_2CHCH_2Si(CH_3)_3$), bis(isopropyl cyclopentadienyl)tungsten dihydride (($i-C_3H_7C_5H_5)_2WH_2$), and tetrakisdimethylaminozirconium ($Zr(N(CH_3)_2)_4$).

Further examples of the CVD material include bis(2,2,6,6-tetramethyl-3,5-heptanedionite)barium ($Ba((t-C_4H_9$ $CO)_2CH)_2$), bis(2,2,6,6-tetramethyl-3,5-heptanedionite) strontium ($Sr((t-C_4H_9CO)_2CH)_2$), tetra(2,2,6,6-tetramethyl-3,5-heptanedionite)titanium ($Ti((t-C_4H_9CO)_2CH)_4$), tetra(2,2,6,6-tetramethyl-3,5-heptanedionite)zirconium ($Zr((t-C_4H_9CO)_2CH)_4$) and bis(2,2,6,6-tetramethyl-3,5-heptanedionite)lead $Pb((t-C_4H_9CO)_2CH)_2$).

The above compounds can be used directly or as a solution in a solvent such as hexane, heptane, butyl acetate, isopropyl alcohol and tetrahydrofuran.

The vessel of a liquid material is a vessel which is used for supplying the CVD material. The size and the shape of the vessel are not particularly limited as long as the vessel can contain a liquid material without any change in the quality.

When the vessel of a liquid material is kept under a raised pressure and the liquid material is supplied to the part for controlling liquid flow rate under the raised pressure, it is preferable that the vessel is resistant to a pressure of at least about 5 $kgf/cm^2$.

In the present invention, the part for controlling liquid flow rate supplies the liquid material to the vaporizer quantitatively with a high accuracy. This part is constituted with a combination of a pump with variable flow rate and a control valve or a combination of a pump and a flow rate controller.

As the pump in the apparatus of the present invention, a bellows pump having a twin or more structure and resistance to corrosion is used in order to supply the liquid material without pulsation. A check valve may be disposed at the downstream of the pump so that the flow rate can be controlled even when the CVD apparatus is operated under a reduced pressure.

Using the part for controlling liquid flow rate having the above construction, the CVD liquid material can be supplied to the vaporizer with a high accuracy with little pulsation even when the CVD apparatus system is kept under a reduced pressure.

In the present invention, the liquid material is supplied with a minimum pulsation by using a pump, by using a pump and a flow control valve or by keeping the vessel of the liquid material under a raised pressure and using a flow control valve.

In the present invention, a pump which can supply the liquid material quantitatively with a high accuracy without deterioration in the quality of the material even when the CVD apparatus is operated under an atmospheric pressure or a reduced pressure and shows no leakage of the liquid material or the gas, is preferably used. Examples of the pump are as follows:

(1) An example of the pump for a liquid material with flow rate control has the following structure: A casing of the pump is divided into two chambers with a cylindrical bellows having many folds. The inner chamber inside the bellows is equipped with a piston sealed from the outside with a packing and contains a hydraulic fluid. A fitting for an inlet having an admission valve disposed therein and a fitting for an outlet having a discharge valve which is disposed therein and works at a pressure difference of 1.0 to 100 $kg/cm^2$ are welded to the casing. The outer chamber outside the bellows is connected to the fitting for an inlet and the fitting for an outlet. A liquid material is admitted or discharged by the movement of the bellows which contracts or expands by the sliding movement of the piston.

Figure 4:
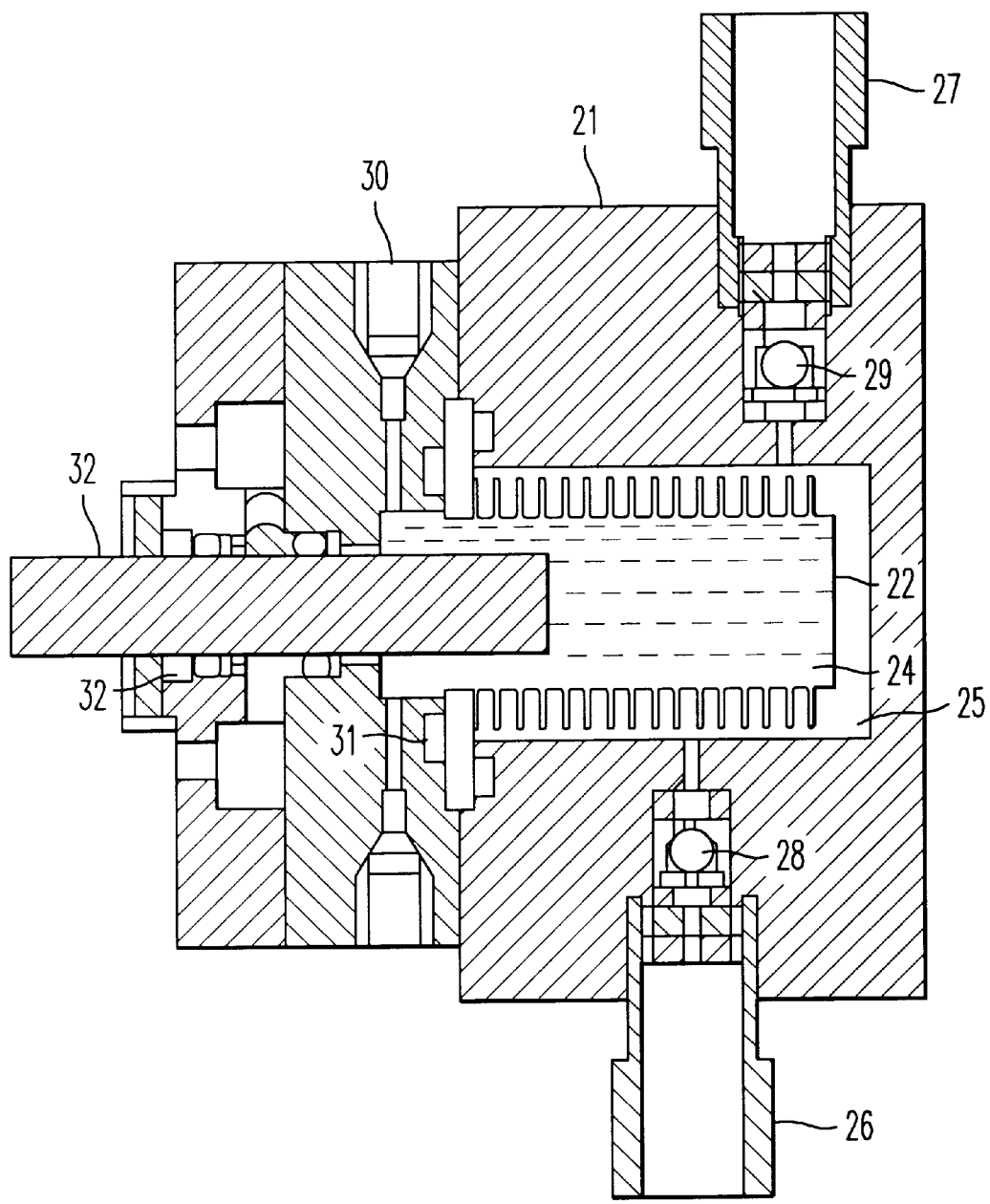
FIG. 4 shows a section view exhibiting an example of a pump for controlling flow rate used in the apparatus of the present invention.

In this pump, the casing is divided into two chambers by the bellows. The volume inside the bellows can be changed by the hydraulic fluid filled into the chamber inside the bellows and the sliding movement of the piston disposed inside the bellows. The liquid material is admitted or discharged by the change in the volume. A specific example of this pump is shown in FIG. 4.

In this pump, the height of the folds in the bellows relative to the diameter of the bellows is not particularly limited. The ratio of the height of the folds to the diameter of the bellows is generally about 0.1 to 0.35, preferably about 0.15 to 0.25. The ratio of the diameter to the length of the cylindrical bellows is generally about 0.15 to 10, preferably about 0.3 to 5. The thickness of the metal plate used as the bellows is different depending on the material and the size of the bellows and cannot be generally defined. The thickness is generally about 0.03 to 0.5 mm, preferably about 0.08 to 0.3 mm. SUS316, SUS316L, tantalum or inconel is generally used as the material of the bellows. The diameter and the sliding length of the piston used for changing the volume inside the bellows are not particularly limited. The ratio of the maximum sliding length to the diameter of the piston is generally about 0.2 to 10, preferably about 0.5 to 5.

The maximum deformation of the bellows by the sliding movement of the piston is generally about 2 to 65%, preferably about 5 to 30%, of the length of the bellows under no load.

The admission valve and the discharge valve disposed in the fittings is generally constituted with a combination of a ball or a plug of a cone and a sheet or a combination of a ball or a plug of a cone, a sheet and an elastic part such as a spring. A valve which works at a pressure difference of about 1 to 100 $kg/cm^2$, preferably about 2 to 30 $kg/cm^2$, is used as the discharge valve so that leakage by suction does not take place even when the CVD apparatus is operated under a reduced pressure.

The admission valve and the discharge valve described above are disposed at the inside of the welded fittings. Leakage or contamination through the admission valve or the discharge valve can be prevented by adopting this construction.

SUS316, SUS316L, tantalum or inconel is used as the material of the parts in contact with the liquid material such as the casing of the pump, the valves and the fittings. It is preferable that the above material is treated by electropolishing.

The frequency of the sliding of the piston per one pump unit is generally about 1 to 30 times per second, preferably about 2 to 15 times per second. When the frequency is less than the above range, pulsation increases. When the frequency exceeds the above range, the accuracy of the pumping decreases.

In FIG. 4, the inside of a casing 21 is divided into two chambers with a bellows 22 having many folds. A piston 23 is inserted into the inner chamber inside the bellows in such a manner that the piston can move by sliding. A hydraulic fluid 24 is sealed into the inner chamber to fill the remaining space. A fitting for an inlet 26 and a fitting for an outlet 27 are welded to an upper part and an lower part, respectively, of the casing and an admission valve 28 and a discharge valve 29 are disposed in the fitting for an inlet and the fitting for an outlet, respectively. The discharge valve is set so that the valve works at a pressure difference of about 1 to 100 $kg/cm^2$ using a spring or the like.

The bellows contracts or expands by the sliding movement of the piston. A liquid material 25 is admitted or discharged by the change in the volume of the bellows and transferred quantitatively.

(2) Another example of the pump for a liquid material with flow rate control has the following structure: A cylinder and a piston which makes sliding movement inside the cylinder are disposed in a casing. The piston is sealed from the outside with a packing. A part which is sealed with a gas and has a length at least the same as the length of the sliding movement of the piston is disposed between a driving part of the piston and the packing. A fitting for an inlet and a fitting for an outlet are welded to the casing. The fitting for an inlet has an admission valve disposed therein and the fitting for an outlet has a discharge valve which is disposed therein and works at a pressure difference of 1.0 to 100 kg/cm$^2$. The cylinder is connected to the fittings and admits and discharges a liquid material by the sliding movement of the piston.

Figure 5:
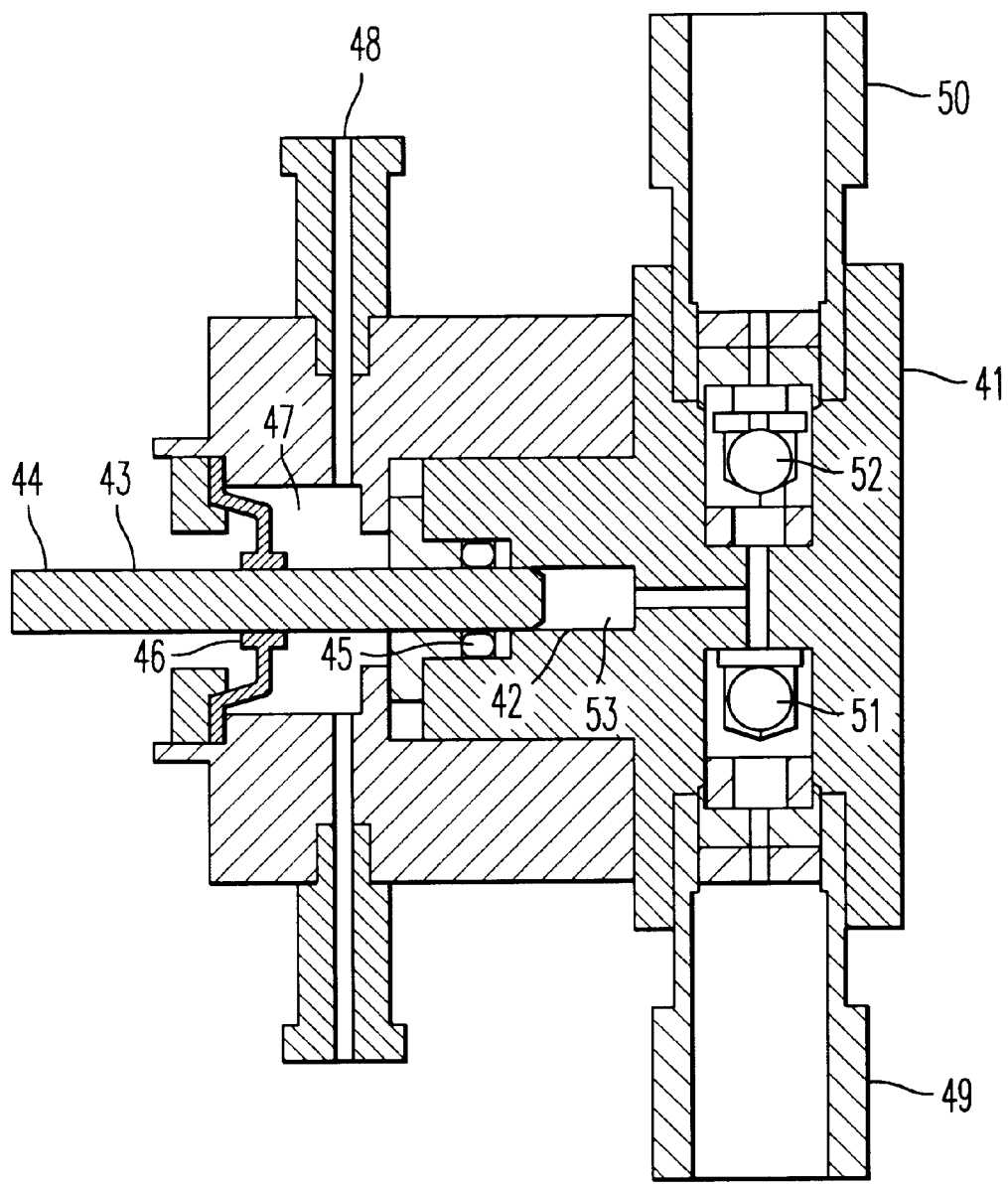
FIG. 5 shows a section view exhibiting another example of a pump for controlling flow rate used in the apparatus of the present invention.

In this pump, the part sealed with a gas is disposed at the sliding part of the piston and an inert gas is passed through the part sealed with a gas. The fittings are welded to the casing and the admission valve and the discharge valve are disposed therein. The liquid material is admitted or discharged by the sliding movement of the piston. A specific example of this pump is shown in FIG. 5.

The diameter, the length of the sliding movement and the material of the piston in the above pump are the same as those in (1) described above. The chamber sealed with a gas which is disposed between the driving part of the piston and the packing is formed by disposing a sealing wall. The sealing wall may be a grand packing similar to the packing or may be a simple sealing wall which is made of a fluororesin and has a disk shape with a hole of a sufficient sealing property at the center. It is necessary that the chamber sealed with a gas has a length which allows a small amount of the liquid material attached to the piston so that the part in contact with the outside atmosphere is completely sealed. The length of the chamber sealed with a gas is generally at least the same as the sliding length of the piston, preferably longer than the sliding length of the piston by about 5 to 10 mm. The sealing gas which is passed through the chamber sealed with a gas is an inert gas such as nitrogen, argon and helium. A purified gas which does not contain water or carbon dioxide is used. The gas is introduced from the inlet for a gas, and a path of the gas is formed in such a manner that the gas sweeps the piston.

As the admission valve, the discharge valve and the fittings for connection to the pump, the same valves and fittings as those in (1) described above are used.

It is preferable that two or more pump units having the above construction are used in a parallel arrangement in order to prevent pulsation in the supply of the liquid material. The frequency of the sliding per one pump unit is the same as that in (1) described above. In FIG. 5, a cylinder 42 and a piston 43 sliding inside the cylinder are disposed in a casing 41. A chamber sealed with a gas 47 is formed by a gas sealing wall 46 disposed between a driving part of a piston 44 and a packing 45. An inert gas such as nitrogen, argon and helium is passed through an inlet of an inert gas 48 and the chamber sealed with a gas. A fitting for an inlet 49 and a fitting for an outlet 50 are welded to an upper part and a lower part of the casing, respectively, and an admission valve 51 and a discharge valve 52 are disposed in the fitting for an inlet and the fitting for an outlet, respectively. The discharge valve is set so that the valve works at a pressure difference of about 1 to 100 kg/cm$^2$ using a spring or the like.

A liquid material 53 is admitted or discharged by the sliding movement of the piston and transferred quantitatively.

In the present invention, by the use of a pump such as that described above in (1) or (2), a liquid material can be supplied quantitatively with a high accuracy while the liquid material is completely sealed from the outside atmosphere. Thus, the liquid material can be supplied continuously for a long period of time without deterioration in the quality.

Alternatively, the liquid material can be supplied with a high accuracy by using a controller of liquid flow rate in place of the pump described above while the vessel of a liquid material is maintained at a raised pressure.

The advantages achieved by the apparatus for vaporizing and supplying a material of the present invention are as follows:

(1) A vaporized gas having a desired concentration can always be supplied because the liquid material supplied from the part for controlling liquid flow rate is entirely and immediately atomized and vaporized.

(2) There is no possibility of deterioration in the quality because it is not necessary that the liquid material is heated in advance.

(3) A gas having a prescribed concentration can always be obtained because aggregation of the atomized material or condensation of the vaporized gas does not take place in the apparatus.

(4) The material can be supplied without overheating because the carrier gas is circulated and very efficient heat transfer is achieved in the vaporizer.

(5) Gases can be mixed or replaced efficiently in the vaporizer because the vaporizer has a shape of a sphere or a shape of a cylinder or a cone having round end parts.

(6) A small vaporizer can have a large ability of vaporization because of excellent heat transfer.

(7) The material can be supplied with a high accuracy independently of the operating conditions of the CVD apparatus, such as an operation at an atmospheric pressure or at a reduced pressure.

The present invention is described with reference to the following Examples. However, the present invention is not limited to the Examples.

EXAMPLE 1

The same apparatus for vaporizing and supplying a material as that shown in FIG. 1 was prepared. The vessel was made of SUS316L and treated by the electropolishing. Controllers of liquid flow rate of the same twin bellows type as that shown in FIG. 4 were used, and each controller works at 0.15 to 75 strokes per minute in accordance with the flow rate. A check valve which works at 5 kg/cm$^2$ was used in the outlet side. The vaporizer which was connected to the pump with VCR fitting had a spherical shape having an outer diameter of 114 mm and connected to three inlets for a liquid material through a switching valve. A vibrator of an ultrasonic atomizing device was disposed at the center of the vaporizer. Two inlets for a carrier gas were attached to the vaporizer in the direction which was parallel with a plane perpendicular to an outlet of a vaporized gas and at an angle of 30 degrees with the tangent of the inner face of the vaporizer at the position where the inlet for a carrier gas was attached so that a carrier gas was introduced into an upper part of the vaporizer through a mass flow controller and an electric heater. A buffer tank having the same shape and size as those of the vaporizer and made of SUS316L was disposed at an outlet of the vaporizer. The vaporizer and the buffer tank were covered with a block heater having a shape fitting the shapes of the vaporizer and the buffer tank.

The vaporizer, the buffer tank and a line for supplying the vaporized gas from the buffer tank to a CVD apparatus were heated and maintained at 80±1° C. The pressure in the parts from the vaporizer to the CVD apparatus was maintained at 2.5 Torr. A helium carrier gas heated to 80° C. was supplied at the flow rate of 100 ml/min from the vaporizer to the CVD apparatus while the ultrasonic vibrator was activated. Then, allyltrimethylsilane adduct of hexafluoroacetylacetonecopper was supplied at the flow rate of 0.1 ml/min from the vessel of a liquid material through the part for controlling liquid flow rate. Helium was added between the apparatus for vaporizing and supplying a material and the CVD apparatus at the flow rate of 100 ml/min as the diluting gas.

A substrate coated with a film of titanium nitride was set at the CVD apparatus. The vaporized gas was supplied while the apparatus was heated to 200° C. and growth of the film of copper metal was measured. A uniform film having a thickness of 278 nm was found to have been formed in the treatment for 5 minutes. This amount corresponds to 91% of the copper supplied as the raw material.

EXAMPLE 2

The same procedures were conducted as those conducted in Example 1 except that the flow rate of allyltrimethylsilane adduct of hexafluoroacetylacetonecopper was changed to 0.25 ml/min. A trap cooled with liquid nitrogen was placed between the apparatus for vaporizing and supplying a material and the CVD apparatus so that the vaporized gas could be collected into the trap by switching the path by a valve. The material in the vaporized gas was collected into the trap by cooling, and the collected substance was analyzed in accordance with the quadrapole mass spectrometry.

It was confirmed that allyltrimethylsilane adduct of hexafluoroacetylacetonecopper was collected in an amount corresponding to 99% of the raw material supplied. No deterioration in the quality of the raw material was found.

What is claimed is:

1. An apparatus for vaporizing a liquid material and supplying the liquid material in a gas phase, comprising:
    a vessel of the liquid material;
    a liquid flow rate control device;
    an ultrasonic atomizing device; and
    a vaporizer equipped with at least one inlet for the liquid material, at least one inlet for a carrier gas connected with a gas heater and an outlet for a vaporized gas, the vaporizer being covered with a block heater and having a shape of a sphere, a shape of an ellipsoid, a shape of a barrel, a shape of a cylinder, a cone, a truncated cone or a hemisphere each having a round surface at end parts, a shape similar to these shapes or a combination of these shapes.

2. An apparatus according to claim 1, wherein the at least one inlet for a carrier gas is disposed in a direction which induces formation of a circular flow of the carrier gas in the vaporizer.

3. An apparatus according to claim 1, wherein the at least one inlet for a carrier gas is disposed in a direction which is parallel with a plane perpendicular to the outlet for a vaporized gas and is oblique with respect to an inner face of the vaporizer.

4. An apparatus according to claim 1, wherein the ultrasonic atomizing device is disposed inside the vaporizer.

5. An apparatus according to claim 1, wherein the ultrasonic atomizing device is disposed at the at least one inlet for the liquid material.

6. An apparatus according to claim 1, wherein the liquid material is supplied with a minimum pulsation by at least one of using a pump, using a pump and a flow control valve, and keeping the vessel of the liquid material under a raised pressure and using a flow control valve.

7. An apparatus according to claim 1, wherein the vessel of the liquid material, the liquid flow rate control device and the vaporizer use at least one of a plurality of fittings having a helium leak rate of $10^{-9}$ Torr•liter/sec or less and a plurality of welded fittings.

8. A vaporizer comprising:
    at least one inlet for a liquid material;
    at least one inlet for a carrier gas connected with a gas heater; and
    an outlet for a vaporized gas,
    wherein the vaporizer is covered with a block heater and has a shape of a sphere, a shape of an ellipsoid, a shape of a barrel, a shape of a cylinder, a cone, a truncated cone or a hemisphere each having a round surface at end parts, a shape similar to these shapes or a combination of these shapes, and
    wherein the inlet for a carrier gas is disposed in a direction which induces formation of a circular flow of the carrier gas in the vaporizer.

9. A process for vaporizing and supplying a material, comprising the steps of:
    introducing a liquid material into a vaporizer which has a shape of a sphere, a shape of an ellipsoid, a shape of a barrel, a shape of a cylinder, a cone, a truncated cone or a hemisphere each having round surfaces at end parts, a shape similar to these shapes or a combination of these shapes, through an inlet for the liquid material by a liquid flow rate control device;
    atomizing the liquid material by an ultrasonic atomizing device disposed inside the vaporizer;
    vaporizing the atomized liquid material by bringing the material into contact with a heated carrier gas which is introduced through an inlet for a carrier gas of the vaporizer and circles along an inner face of the vaporizer; and
    supplying the vaporized material to an apparatus for producing semiconductors.

10. A process for vaporizing and supplying a material, comprising the steps of:
    atomizing a liquid material by an ultrasonic atomizing device;
    introducing the atomized liquid material into a vaporizer which has a shape of a sphere, a shape of an ellipsoid, a shape of a barrel, a shape of a cylinder, a cone, a truncated cone or a hemisphere each having round surfaces at end parts, a shape similar to these shapes or a combination of these shapes, through an inlet for the liquid material;
    vaporizing the atomized liquid material by bringing the atomized liquid material into contact with a heated carrier gas which is introduced through an inlet for a carrier gas of the vaporizer and circles along an inner face of the vaporizer; and
    supplying the vaporized material to an apparatus for producing semiconductors.

* * * * *